(12) United States Patent
Chikaki et al.

(10) Patent No.: US 8,981,563 B2
(45) Date of Patent: Mar. 17, 2015

(54) SEMICONDUCTOR DEVICE AND METHOD OF MANUFACTURING THE SAME

(75) Inventors: Shinichi Chikaki, Kanagawa (JP); Takahiro Nakayama, Ibaraki (JP)

(73) Assignees: Renesas Electronics Corporation, Kanagawa (JP); Ulvac, Inc., Kanagawa (JP)

( * ) Notice: Subject to any disclaimer, the term of this patent is extended or adjusted under 35 U.S.C. 154(b) by 996 days.

(21) Appl. No.: 13/125,908

(22) PCT Filed: Oct. 22, 2009

(86) PCT No.: PCT/JP2009/005550
§ 371 (c)(1),
(2), (4) Date: Apr. 25, 2011

(87) PCT Pub. No.: WO2010/047118
PCT Pub. Date: Apr. 29, 2010

(65) Prior Publication Data
US 2011/0204519 A1    Aug. 25, 2011

(30) Foreign Application Priority Data

Oct. 24, 2008    (JP) .................................. 2008-274798

(51) Int. Cl.
*H01L 23/48*    (2006.01)
*H01L 23/52*    (2006.01)
(Continued)

(52) U.S. Cl.
CPC .... *H01L 23/53238* (2013.01); *H01L 21/02337* (2013.01); *H01L 21/02359* (2013.01); *H01L 21/3105* (2013.01); *H01L 21/7682* (2013.01);
(Continued)

(58) Field of Classification Search
CPC ............ H01L 27/1225; H01L 29/7869; H01L 21/76826; H01L 21/76877; H01L 21/76831; H01L 21/2885; H01L 23/5329
USPC .................. 438/637, 638, 676; 257/758, 759
See application file for complete search history.

(56) References Cited

U.S. PATENT DOCUMENTS 7,057,287 B2    6/2006    Kumar et al.
7,067,925 B2    6/2006    Abell
(Continued)

FOREIGN PATENT DOCUMENTS

JP    2007-012996    1/2007
JP    2007-12996    1/2007
(Continued)

OTHER PUBLICATIONS

Notice of Reasons for Rejection dated Apr. 23, 2013 issued by the Japanese Patent Office in Japanese Patent Application No. 2010-534714 with English translation of the portions enclosed in wavy lines, 9 pages.
(Continued)

*Primary Examiner* — Michelle Mandala
(74) *Attorney, Agent, or Firm* — Young & Thompson (57) ABSTRACT

A semiconductor device includes a first interconnect, a porous dielectric layer formed over the first interconnect, a second interconnect buried in the porous dielectric layer and electrically connected to the first interconnect, and a carbon-containing metal film that is disposed between the porous dielectric layer and the second interconnect and isolates these layers.

13 Claims, 8 Drawing Sheets (51) Int. Cl.
*H01L 29/40* (2006.01)
*H01L 23/532* (2006.01)
*H01L 21/02* (2006.01)
*H01L 21/3105* (2006.01)
*H01L 21/768* (2006.01)

(52) U.S. Cl.
CPC .... *H01L 21/76825* (2013.01); *H01L 21/76831* (2013.01); *H01L 21/76843* (2013.01); *H01L 21/76846* (2013.01); *H01L 23/53223* (2013.01); *H01L 23/53295* (2013.01); *H01L 2924/0002* (2013.01)
USPC .......... 257/759; 257/758; 438/637; 438/638; 438/676

(56) References Cited

U.S. PATENT DOCUMENTS

| | | | |
|---|---|---|---|
| 7,135,402 | B2 | 11/2006 | Lin et al. |
| 7,217,648 | B2 | 5/2007 | Lu et al. |
| 7,473,634 | B2 | 1/2009 | Suzuki |
| 7,612,452 | B2 | 11/2009 | Ohba et al. |
| 2006/0244152 | A1 | 11/2006 | Abell |
| 2007/0001307 | A1 | 1/2007 | Usui et al. |
| 2008/0054467 | A1 | 3/2008 | Ohba et al. |

FOREIGN PATENT DOCUMENTS

| | | |
|---|---|---|
| JP | 2007-043018 | 2/2007 |
| JP | 2007-173511 | 7/2007 |
| JP | 2008-066428 | 3/2008 |
| TW | 200623271 | 7/2006 |
| TW | 200629467 | 8/2006 |
| TW | 200832558 | 8/2008 |

OTHER PUBLICATIONS

Notice of Office Action issued Dec. 18, 2012 by Taiwanese Patent Office in Taiwan Patent Application No. 098135952 with full English translation, 15 pages.

International Search Report, PCT/JP2009/005550, Jan. 19, 2010.

SEMICONDUCTOR DEVICE AND METHOD OF MANUFACTURING THE SAME

TECHNICAL FIELD

The present invention relates to a semiconductor device provided with a porous dielectric layer and a method of manufacturing the same.

BACKGROUND ART

Patent Document 1 discloses a method of improving the covering completeness of a barrier film by attaching a polymer film onto a porous dielectric film surface by a hydrocarbon plasma treatment.

Figure 5:
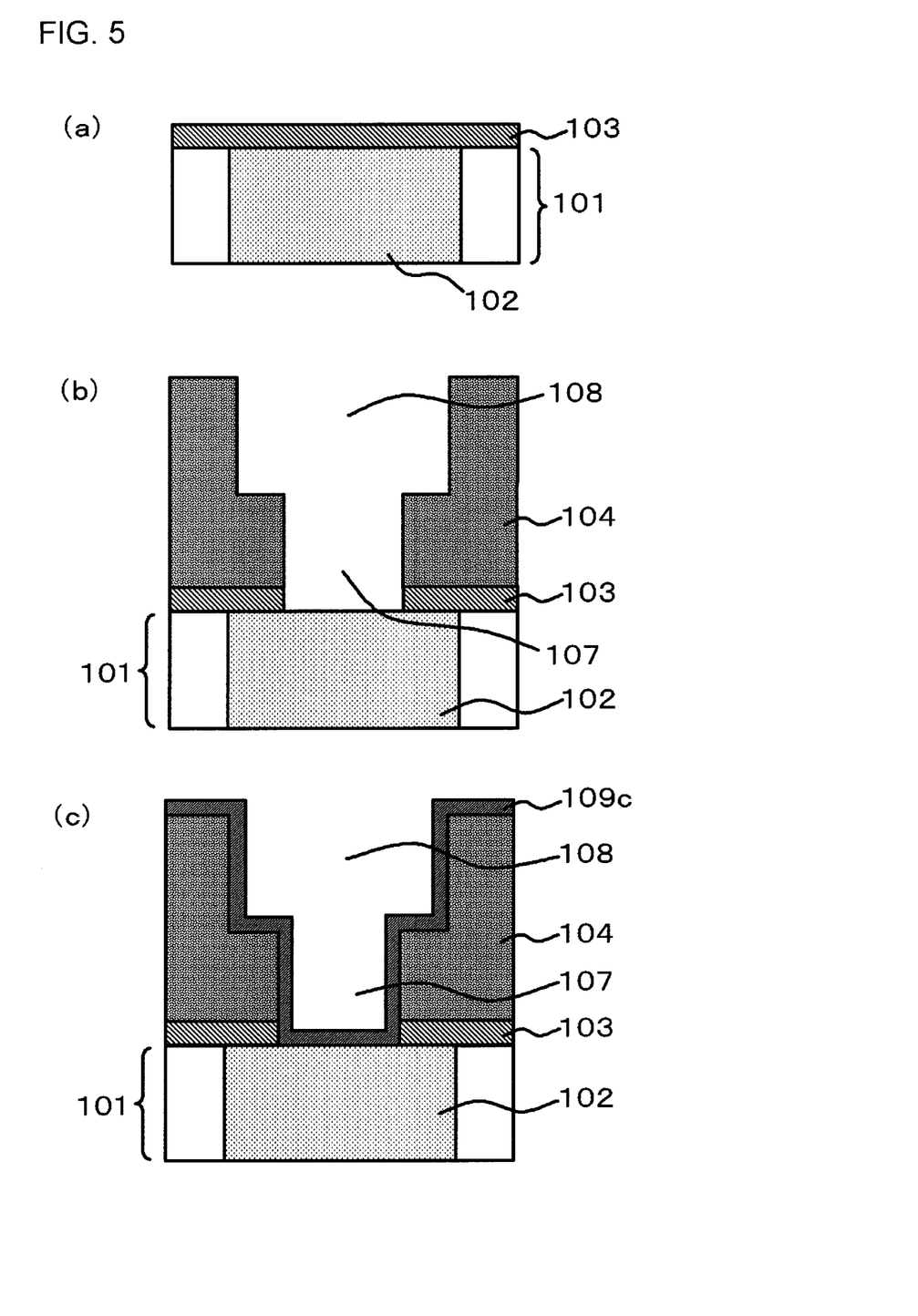
FIG. 5 is a cross-sectional view showing steps of a conventional method of manufacturing a semiconductor device.

In the method disclosed in Patent Document 1, first, as shown in FIG. 5(a), an etching-stop diffusion-barrier film 103 is formed on an underlayer film 101 having an interconnect 102 on a semiconductor substrate. The etching-stop diffusion-barrier film is typically a silicon nitride film ($Si_3N_4$) or a silicon carbide film (SiC). Then, a porous dielectric layer 104 having a low dielectric constant is formed. Thereafter, a via 107 and a trench 108 are formed by etching with use of a photoresist mask. After the mask is removed by asking, the via penetrates through the porous dielectric layer 104 and the etching-stop diffusion-barrier film 103 to reach the interconnect 102, and the trench is provided with a cross-sectional shape having a depth of about ½ of the film thickness of the porous dielectric layer 104 (FIG. 5(b)).

Then, the hydrocarbon gas plasma treatment is carried out to attach a thin polymer film 109c onto the interlayer insulating film surface and onto the surface of the interconnect exposed at the bottom part of the via 107 (FIG. 5(c)). The polymer film 109c is formed under a pressure of 7 to 60 mTorr and with a power of 500 to 1700 W by using a $C_2H_4$ gas.

Figure 6:
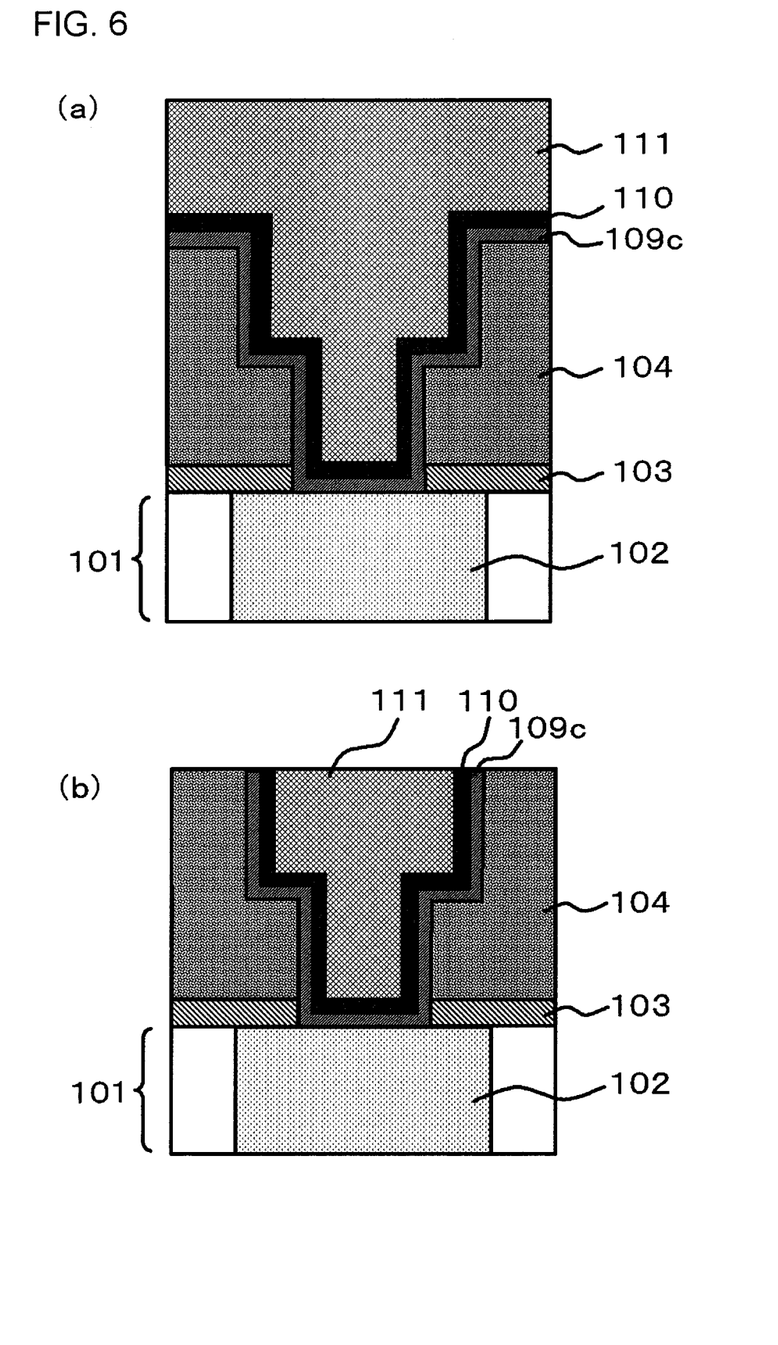
FIG. 6 is a cross-sectional view showing steps of a conventional method of manufacturing a semiconductor device.

After forming a TaN film 110 having a Cu barrier property and a power-feeding Cu film at the time of Cu plating by the PVD method, a Cu film 111 is buried into the via 107 and the trench 108 by the plating method (FIG. 6(a)). Then, by CMP, the Cu film 111, the TaN film 110, and the polymer film 109c on the porous dielectric layer top surface are successively removed, so as to form an interconnect (FIG. 6(b)).

Also, Patent Document 2 discloses the following method.

Figure 7:
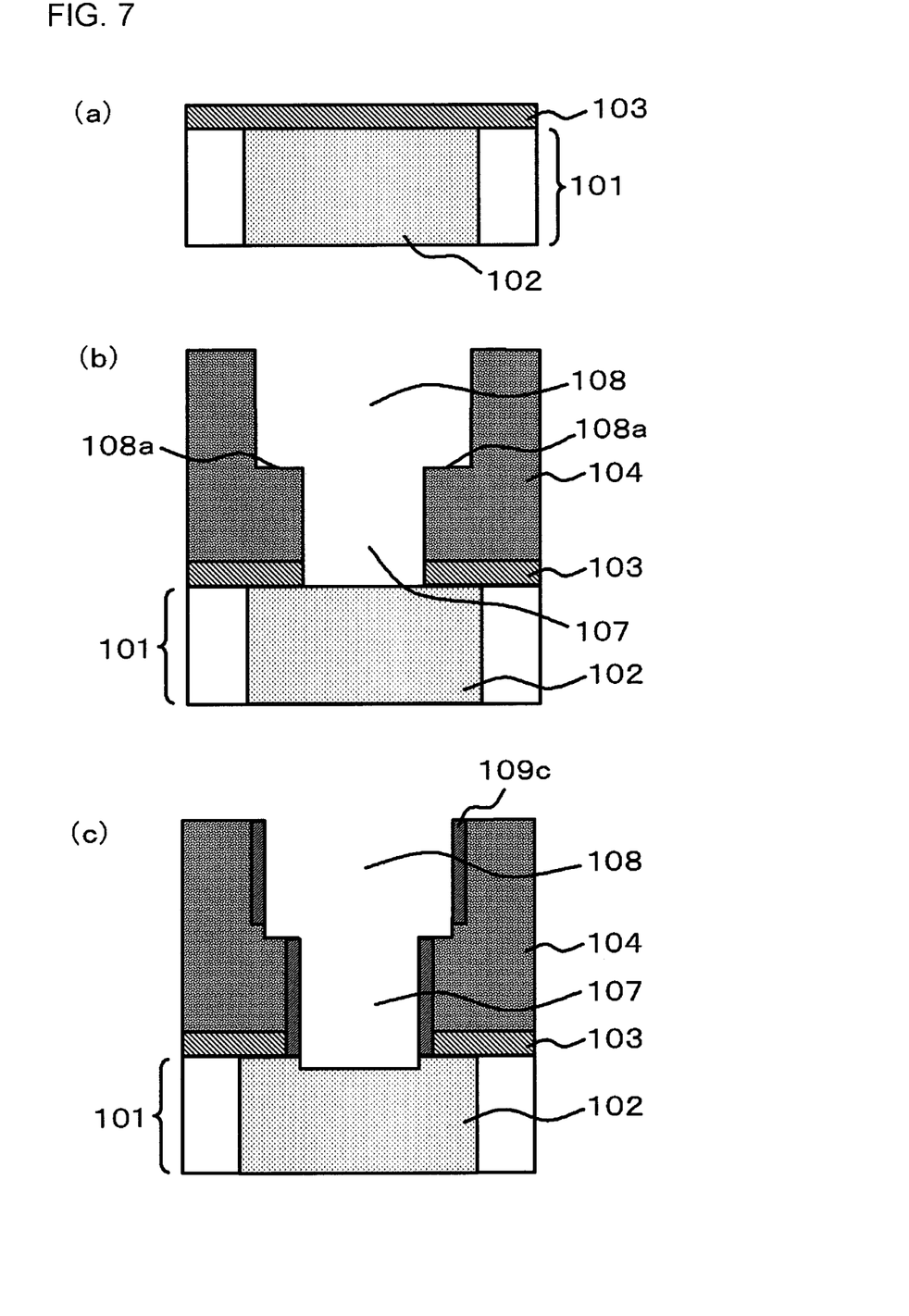
FIG. 7 is a cross-sectional view showing steps of a conventional method of manufacturing a semiconductor device.

First, as shown in FIG. 7(a), an etching-stop diffusion-barrier film 103 is formed on an underlayer film 101 having an interconnect 102 on a semiconductor substrate. Then, a via 107 and a trench 108 are formed by a predetermined method in a porous dielectric layer 104 having a low dielectric constant (FIG. 7(b)).

Then, a polymer film 109c is attached onto the side wall of the via 107 and the trench 108 and onto the utmost surface of the substrate by CVD or the application method. Subsequently, by anisotropic plasma etching, the polymer film 109c is allowed to remain on the side surface of the via 107 and the trench 108 (FIG. 7(c)).

Figure 8:
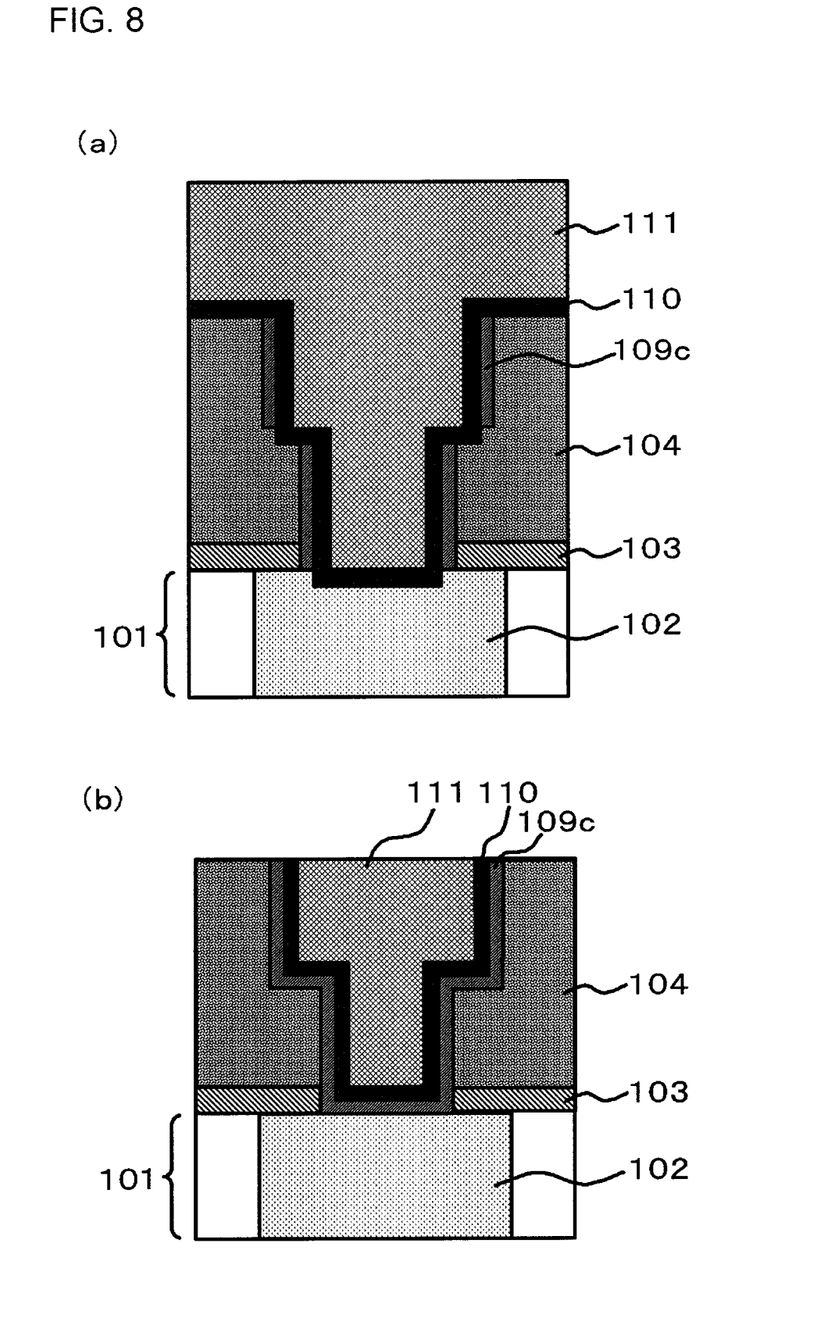
FIG. 8 is a cross-sectional view showing steps of a conventional method of manufacturing a semiconductor device.

After forming a TaN film 110 having a Cu barrier property and a power-feeding Cu film at the time of Cu plating by the PVD method, a Cu film 111 is buried into the via 107 and the trench 108 by the plating method (FIG. 8(a)). Then, by CMP, the Cu film 111, the TaN film 110, and the polymer film 109c on the porous dielectric layer top surface are successively removed, so as to form an interconnect (FIG. 8(b)).

PRIOR ART DOCUMENTS

Patent Documents

Patent Document 1
U.S. Pat. No. 7,067,925

Patent Document 2
U.S. Pat. No. 7,057,287

DISCLOSURE OF THE INVENTION

However, the technique disclosed in the above-described documents has room for improvement on the following points.

In the method disclosed in Patent Document 1, the polymer film 109c is formed on the interconnect surface of the via bottom, so that the contact resistance between the lower-layer interconnect 102 and the via interconnect (Cu film 111) has sometimes become high. In particular, in recent years, in order to realize an improvement in the performance of LSI, reduction of the interconnect pitch and increase in the number of multilayer interconnect layers have been advanced. Since the via resistance is proportional to the area of the via bottom, the via resistance tends to increase at a rate more than the rate of reduction of the interconnect pitch. Also, as the number of interconnect layers increases, the ratio of the via resistance that occupies the interconnect resistance increases.

In other words, in the semiconductor device disclosed in Patent Document 1, the resistance between the interconnects has sometimes increased, thereby leading to decrease in the connection reliability. For this reason, decrease in the product quality of the semiconductor device and decrease in the yield have been provoked.

In the semiconductor device disclosed in Patent Document 2, in the via and the trench, there are places that do not have a polymer film. For this reason, even if the semiconductor device has a barrier metal film, diffusion of Cu into the porous film is not sufficiently suppressed, whereby electromigration, stress migration, or the like may sometimes occur, leading to decrease in the connection reliability.

Also, in the method disclosed in Patent Document 2, the anisotropic etching carried out in order to allow the thin polymer film 109c to remain only on the side wall of the via 107 and the trench 108 has a higher etching speed in the film located closer to the utmost surface of the substrate because of the influence of the going-around of the etching gas. For this reason, while the polymer film 109c attached to the via bottom is being completely removed, the polymer film 109c attached to the trench bottom 108a and the polymer film 109c at the uppermost surface of the substrate are removed earlier, so that even the film located in the layer therebelow is extraneously removed. Since the porous dielectric layer 104 has a smaller density than the polymer film 109c, the etching speed is higher, and it is difficult to perform selective etching only on the thin polymer film 109c attached to the trench bottom 108a. As a result thereof, it is difficult to keep the trench depth uniform, so that the interconnect performance is unstable depending on the production lots, and the yield has sometimes decreased.

Also, it is difficult to obtain an optimal etching result for both the polymer film 109c and the porous dielectric layer 104. Moreover, when the porous dielectric layer 104 is etched under an etching condition of the polymer film 109c, the surface of the porous dielectric layer 104 is roughened. For this reason, by overetching after removal of the thin polymer film 109c, the surface of the porous dielectric layer 104 that is exposed on the trench bottom 108a has sometimes been roughened. For this reason, the insulation between the upper and lower interconnect has been sometimes decreased, leading to decrease in the connection reliability.

In this manner, in the method disclosed in Patent Document 2, the connection reliability of the obtained semiconductor device has sometimes decreased. For this reason, decrease in the product quality of the semiconductor device and decrease in the yield have sometimes been provoked.

According to the present invention, there is provided a semiconductor device including a first interconnect, a porous dielectric layer formed over said first interconnect, a second interconnect buried in said porous dielectric layer and electrically connected to said first interconnect, and a carbon-containing metal film that is disposed only between said porous dielectric layer and said second interconnect and isolates these layers.

According to this invention, since the semiconductor device has a carbon-containing metal film that isolates between the porous dielectric layer and the second interconnect, diffusion of the metal is suppressed. For this reason, generation of electromigration, stress migration, or the like is suppressed, whereby the connection reliability is improved. Therefore, a semiconductor device having an interconnect of high quality with a long operation-ensuring lifetime can be provided.

Further, since the semiconductor device does not have an insulative film between the first interconnect and the second interconnect, the contact resistance between the first interconnect and the second interconnect electrically connected thereto become small, so that a high-performance interconnect with a low interconnect resistance is formed. For this reason, the product quality of the semiconductor device is improved, and the yield also is improved.

According to the present invention, there is provided a method of manufacturing a semiconductor device including forming a porous dielectric layer over a first interconnect, forming an interconnect trench in said porous dielectric layer, impregnating said porous dielectric layer with a reactive carbon-containing compound, depositing a metal film on the surface of said porous dielectric layer located at the side surface of said interconnect trench and on the surface of said first interconnect exposed at the bottom surface of said interconnect trench, and forming a carbon-containing metal film on the surface of said porous dielectric layer by introducing the carbon contained in said reactive carbon-containing compound into said metal film, and forming a second interconnect in said interconnect trench where said carbon-containing metal film is formed.

According to this invention, by introducing the carbon contained in the reactive carbon-containing compound into the metal film on the porous dielectric layer surface, a carbon-containing metal film can be formed selectively on the porous dielectric layer surface and, furthermore, an insulating film is not formed on the first interconnect surface. In this manner, by a convenient method, it is possible to cover only the porous dielectric layer surface within the interconnect trench efficiently with a carbon-containing metal film having a high barrier property, whereby a semiconductor device being excellent in connection reliability and product quality with improved yield of the product can be obtained.

The semiconductor device according to the present invention is excellent in the connection reliability between the interconnects, so that the product quality is excellent and the yield is improved. Further, according to the method of manufacturing a semiconductor device according to the present invention, such a semiconductor device can be obtained efficiently by a convenient method.

BEST MODE FOR CARRYING OUT THE INVENTION

Hereafter, embodiments of the present invention is described with reference to the drawings. Here, in all of the drawings, like constituent elements are denoted with like reference numerals, and the description thereof will not be repeated.

First Embodiment

Figure 2:
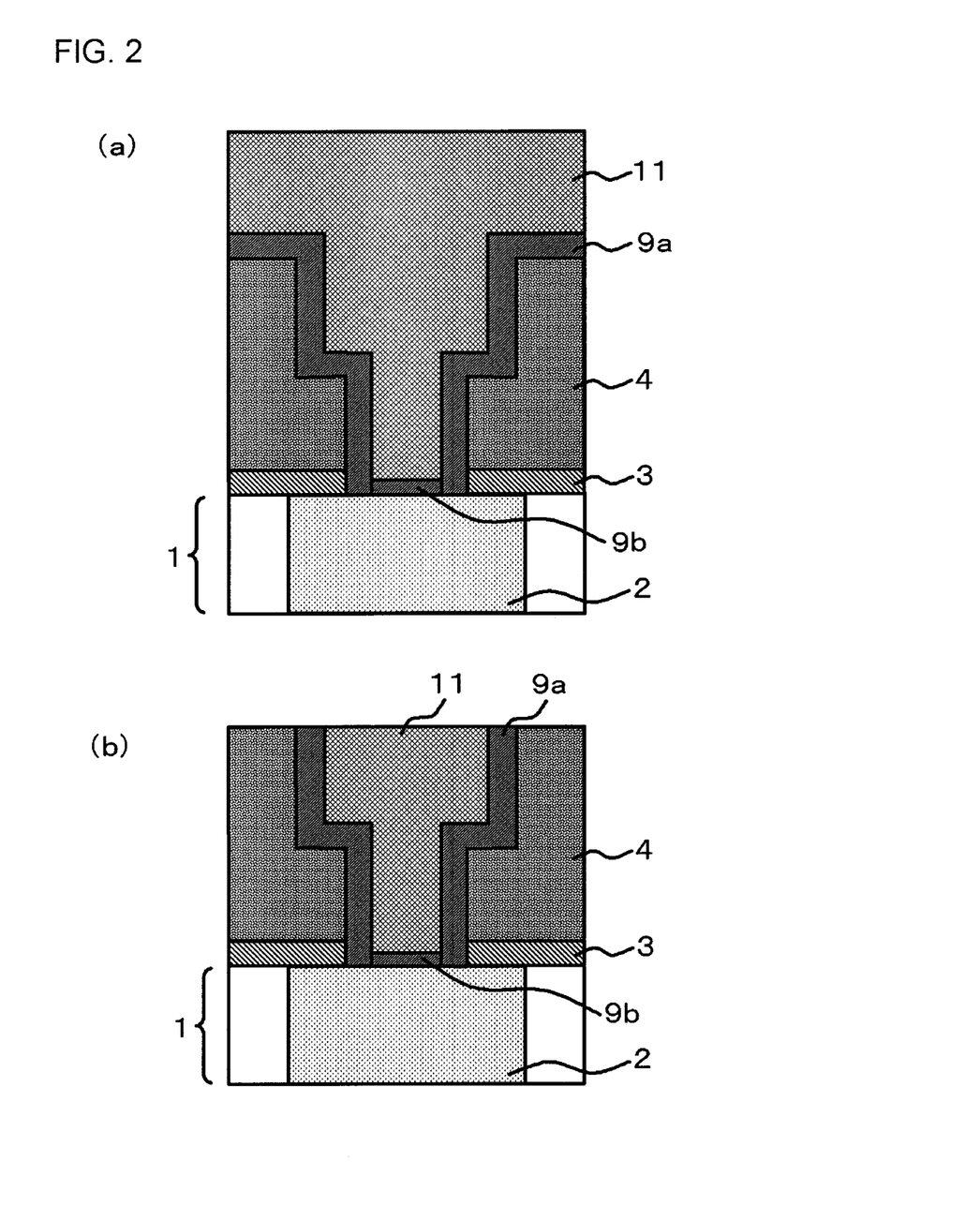
FIG. 2 is a cross-sectional view showing steps of a method of manufacturing a semiconductor device according to the first embodiment.

Referring to FIG. 2(b), a semiconductor device of the present embodiment includes a first interconnect 2, a porous dielectric layer 4 formed on the first interconnect 2, a second interconnect 11 buried in the porous dielectric layer 4 and electrically connected to the first interconnect 2, and a carbon-containing metal film 9a that is disposed between the porous dielectric layer 4 and the second interconnect 11 and isolates these layers. A metal film 9b is provided between the first interconnect 2 and the second interconnect 11. Over an underlayer film 1 including the first interconnect 2, an etching-stop diffusion-barrier film 3 is provided between the underlayer film 1 and the porous dielectric layer 4.

The first interconnect 2 and the second interconnect 11 are formed of an interconnect material having a low resistance, and the material thereof is made, for example, of Cu, Al or an alloy containing these as major components. The etching-stop diffusion-barrier film 3 is not particularly limited and is a silicon nitride film ($Si_3N_4$), a silicon carbide film (SiC) film, a silicon nitride carbide film (SiCN), or the like, and also a stacked film thereof can be used as well.

The porous dielectric layer 4 includes SiOC, $SiO_2$, or the like, and is a porous dielectric film having a low dielectric constant of 2.5 or less.

The carbon-containing metal film 9a includes TiC, TaC, WC, $AlC_3$, or the like. The film thickness of the carbon-containing metal film 9a is 3 nm or more and 50 nm or less. In the present embodiment, description is given by an example using a carbon-containing metal film 9a having a film thickness of about 25 nm. Here, the carbon-containing metal film 9a may contain oxygen atoms.

The metal film 9b is formed of titanium (Ti), tungsten (W), aluminum (Al), tantalum (Ta), or the like.

Next, a method of manufacturing a semiconductor device in the present embodiment is described.

Figure 1:
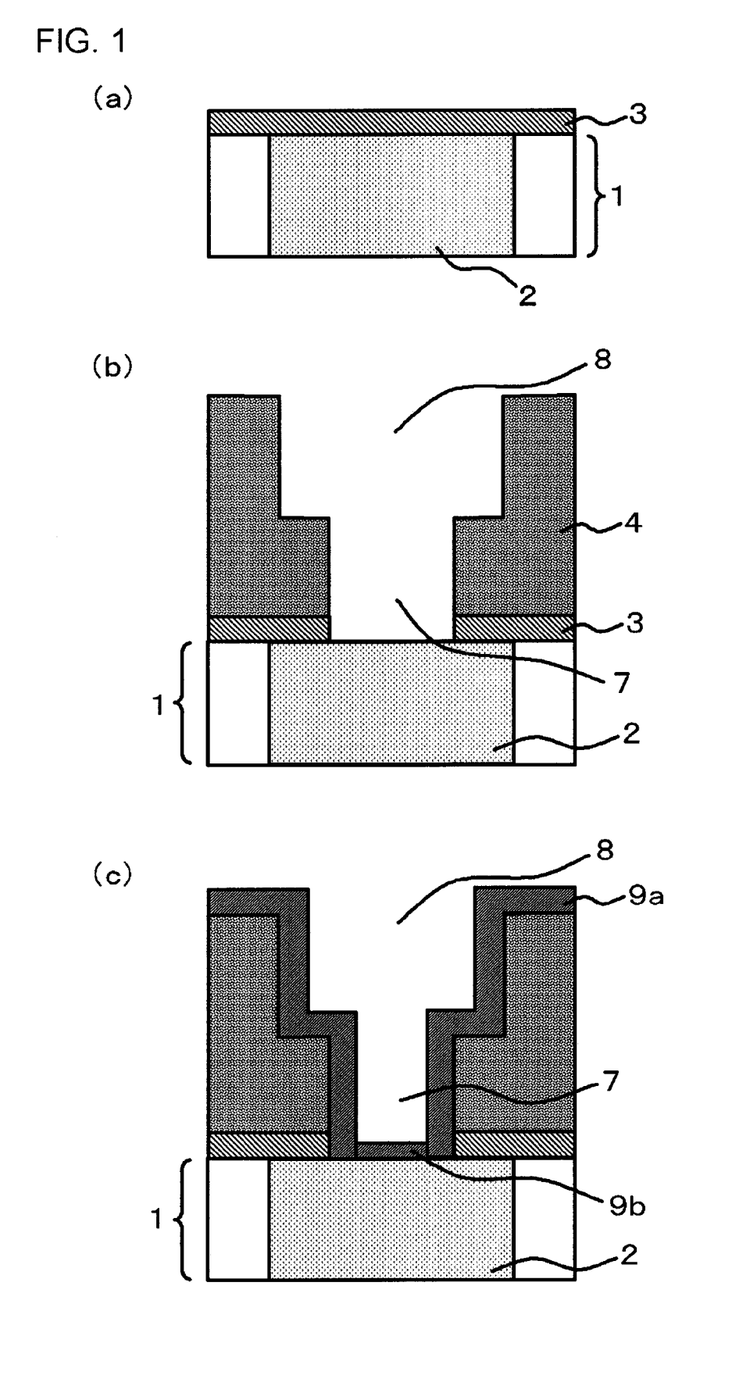
FIG. 1 is a cross-sectional view showing steps of a method of manufacturing a semiconductor device according to a first embodiment.

The method of manufacturing a semiconductor device in the present embodiment includes the following:

(a) forming a porous dielectric layer 4 over a first interconnect 2 (FIGS. 1(a) and 1(b));

(b) forming an interconnect trench (via 7 and trench 8) in the porous dielectric layer 4 (FIG. 1(b));

(c) impregnating the porous dielectric layer 4 with a reactive carbon-containing compound;

(d) depositing a metal film on the surface of the porous dielectric layer 4 located at the side surface of the via 7 and the trench 8 and on the surface of the first interconnect 2 exposed at the bottom surface of the via 7, and forming a carbon-containing metal film 9a on the surface of the porous dielectric layer 4 by introducing the carbon contained in the reactive carbon-containing compound into the metal film (FIG. 1(c)); and (e) forming a second interconnect 11 in the interconnect trench (via 7 and trench 8) where the carbon-containing metal film 9a is formed (FIGS. 2(a) to 2(b)).

Hereafter, each of the above processes is sequentially described.

(a): Forming a Porous Dielectric Layer 4 Over a First Interconnect 2.

First, referring to FIG. 1(a), an etching-stop diffusion-barrier film 3 having a thickness of about 20 nm is formed by the CVD (Chemical Vapor Deposition) method on an underlayer film 1 having a first interconnect 2 on a semiconductor substrate that is not shown in the drawings.

Then, a porous dielectric layer 4 is formed on the etching-stop diffusion-barrier film 3. A material for forming the porous dielectric layer 4 can include one such that the organic substance disappears by decomposition or the like to form porous SiOC or $SiO_2$ in the film-forming step in the CVD method or the SOD (Spin On Dielectric) method, in the subsequent heating step, or in UV radiation when an organic substance that is easily vaporized by heating or UV radiation is added and The material for forming the porous dielectric layer 4 may be, for example, a siloxane oligomer, an organic silicon precursor, a siloxane monomer, or the like. In the present embodiment, a porous dielectric film having a low dielectric constant and made of $SiO_2$ can be formed by applying a solution containing a surfactant and a siloxane oligomer and firing in a 350° C. nitrogen atmosphere.

(b): Forming an Interconnect Trench (Via 7 and Trench 8) in the Porous Dielectric Layer 4

After the porous dielectric layer 4 is formed, the porous dielectric layer 4 is etched with use of a photoresist mask by an ordinary method, so as to form a via 7 and a trench 8. Then, the photoresist mask is removed by asking (FIG. 1(b)). The via 7 penetrates through the porous dielectric layer 4 and the etching-stop diffusion-barrier film 3 to reach the underlayer film 1, and the trench 8 has a depth of about ½ of the film thickness of the porous dielectric layer 4.

(c): Impregnating the Porous Dielectric Layer 4 with a Reactive Carbon-Containing Compound In (c), the porous dielectric layer 4 in which the via 7 and the trench 8 have been formed is exposed to an atmosphere containing a vaporized reactive carbon-containing compound, whereby the porous dielectric layer 4 is impregnated with the reactive carbon-containing compound.

The reactive carbon-containing compound can include a cyclic siloxane, a secondary alcohol that undergoes oxidation reaction or reduction reaction, or the like. The cyclic siloxane may be, for example, hexamethyldisilazane (HMDS), trimethylsilyldimethylamine (TMSDMA), trimethylsilylacetamide (TMSA), tetramethylcyclotetrasiloxane (TMCTS), octamethylcyclotetrasiloxane (OMCTS), or the like. The secondary alcohol may be, for example, isopropanol or the like. These compounds can be used either by one kind or by mixing two or more kinds.

In the present embodiment, in a reduced-pressure furnace heated to about 350° C., the porous dielectric layer 4 in which the via 7 and the trench 8 have been formed is exposed for 30 minutes in a vaporized hexamethyldisilazane (HMDS) atmosphere, whereby the vapor can be diffused into the porous dielectric layer 4. It seems that, by this process, the fine pore surface within the porous dielectric layer 4 is modified by organic silicon or an organic group.

Then, by washing, the reactive carbon-containing compound adhering to the first interconnect surface is removed.

(d): Depositing a Metal Film on the Surface of the Porous Dielectric Layer 4 Located at the Side Surface of the Via 7 and the Trench 8 and on the Surface of the First Interconnect 2 Exposed at the Bottom Surface of the Via 7, and Forming a Carbon-Containing Metal Film 9a on the Surface of the Porous Dielectric Layer 4 by Introducing the Carbon Contained in the Reactive Carbon-Containing Compound into the Metal Film.

First, by the PVD method using a metal sputtering target and a gas plasma such as He or Ar, a metal film is deposited on the surface of the porous dielectric layer 4 and on the surface of the first interconnect 2 exposed at the bottom surface of the via 7. With the heat provided by the PVD (Physical Vapor Deposition) method, the reactive carbon-containing compound is made fugitive from within the porous dielectric layer 4, so as to introduce the carbon contained in the reactive carbon-containing compound into the deposited metal film. As a result, a carbon-containing metal film 9a is formed selectively on the surface of the porous dielectric layer 4, and a metal film 9b is formed on the surface of the first interconnect 2 by the metal deposited by the PVD method (FIG. 1(c)). Here, in the present embodiment, the heat provided by the PVD method includes both the heat of the heated substrate and the heat generated at the time of sputtering.

As the metal sputtering target, a single element of metal that forms a comparatively stable oxide or carbide such as titanium (Ti), tungsten (W), aluminum (Al), or tantalum (Ta), or an alloy thereof can be used.

In the present embodiment, Ti can be deposited on the surface of the porous dielectric layer 4 and on the surface of the first interconnect 2 exposed at the bottom surface of the via 7 by the PVD method using a Ti target and a He gas plasma. A TiC film can be formed as a carbon-containing metal film on the surface of the porous dielectric layer 4. The composition of the carbon-containing metal film 9a can be measured by Auger electron spectroscopy (product name: PHI 650 manufactured by ULVAC-PHI INCORPORATED). Here, a Ti film is formed on the surface of the first interconnect 2.

(e): Forming a Second Interconnect 11 in the Interconnect Trench (Via 7 and Trench 8) where the Carbon-Containing Metal Film 9a is Formed.

In the present embodiment, after a power-feeding film is attached, Cu or Al is buried in the via 7 and the trench 8 by the plating method (FIG. 2(a)). Then, extraneous metal and the like are removed by the ordinary CMP (Chemical Mechanical Polishing) method, so as to form a second interconnect 11.

Then, a semiconductor device is thereafter manufactured by an ordinary process.

Hereafter, effects of the present embodiment is described.

The semiconductor device of the present embodiment has a carbon-containing metal film 9a that isolates between the porous dielectric layer 4 and the second interconnect 11.

The carbon-containing metal film 9a has a high effect of suppressing metal diffusion, so that diffusion of the metal from the second interconnect 11 into the porous dielectric layer 4 is suppressed. For this reason, generation of electromigration, stress migration, or the like is suppressed, and the connection reliability is improved. Therefore, a semiconductor device having an interconnect of high quality with a long operation-ensuring lifetime can be provided.

Furthermore, since an insulating film such as the carbon-containing metal film 9a is not formed between the first interconnect 2 and the second interconnect 11, the contact resistance between the interconnects become small, so that a high-performance interconnect with a low interconnect resistance is formed. For this reason, the product quality of the semiconductor device is improved, and the yield also is improved.

The carbon-containing metal film 9a can contain TiC, TaC, WC or $AlC_3$.

This can effectively suppress the metal diffusion from the second interconnect 11 into the porous dielectric layer 4, whereby a semiconductor device having an excellent connection reliability can be obtained.

The film thickness of the carbon-containing metal film 9a can be set to be 3 nm or more and 50 nm or less.

This can effectively suppress the metal diffusion from the second interconnect 11 into the porous dielectric layer 4, whereby a semiconductor device having an excellent connection reliability can be obtained.

In the method of manufacturing a semiconductor device according to the present embodiment, a metal film is deposited on the surface of the porous dielectric layer 4 impregnated with a reactive carbon-containing compound and on the surface of the first interconnect 2 exposed at the bottom surface of the via 7. In the above process, by introducing the carbon contained in the reactive carbon-containing compound into the deposited metal film, a carbon-containing metal film 9a can be formed only on the surface of the porous dielectric layer 4. Further, an insulating film such as the carbon-containing metal film 9a is not formed between the first interconnect 2 and the second interconnect 11.

According to the present embodiment, by introducing the carbon contained in the reactive carbon-containing compound into the metal film on the surface of the porous dielectric layer 4, a carbon-containing metal film 9a can be formed selectively on the surface of the porous dielectric layer 4 and, furthermore, an insulating film is not formed on the first interconnect 2 surface. In this manner, by a convenient method, a semiconductor device being excellent in the connection reliability and product quality with improved yield of the product can be obtained.

In the present embodiment, the porous dielectric layer 4 is exposed to an atmosphere containing a vaporized reactive carbon-containing compound, so as to make the porous dielectric layer 4 impregnated with the reactive carbon-containing compound.

This can efficiently allow the porous dielectric layer 4 to contain the reactive carbon-containing compound.

The reactive carbon-containing compound in the present embodiment can introduce the carbon into the deposited metal film by heat. For this reason, the metal film can be deposited by sputtering (PVD method) and carbon can be introduced into the metal film by the heat provided in the sputtering.

By such a convenient method, a semiconductor device is manufactured in which the carbon-containing metal film 9a is formed selectively on the surface of the porous dielectric layer 4 and, on the other hand, an insulating film is not formed on the surface of the first interconnect 2.

In the present embodiment, the reactive carbon-containing compound is selected at least from a cyclic siloxane and a secondary alcohol.

The inside of the porous dielectric layer 4 is easily impregnated with these compounds in a vaporized state, and these compounds are evaporated and dispersed by heat of sputtering and can easily introduce carbon into the deposited metal film. For this reason, the carbon-containing metal film 9a can be formed selectively on the surface of the porous dielectric layer 4.

Second Embodiment

Figure 4:
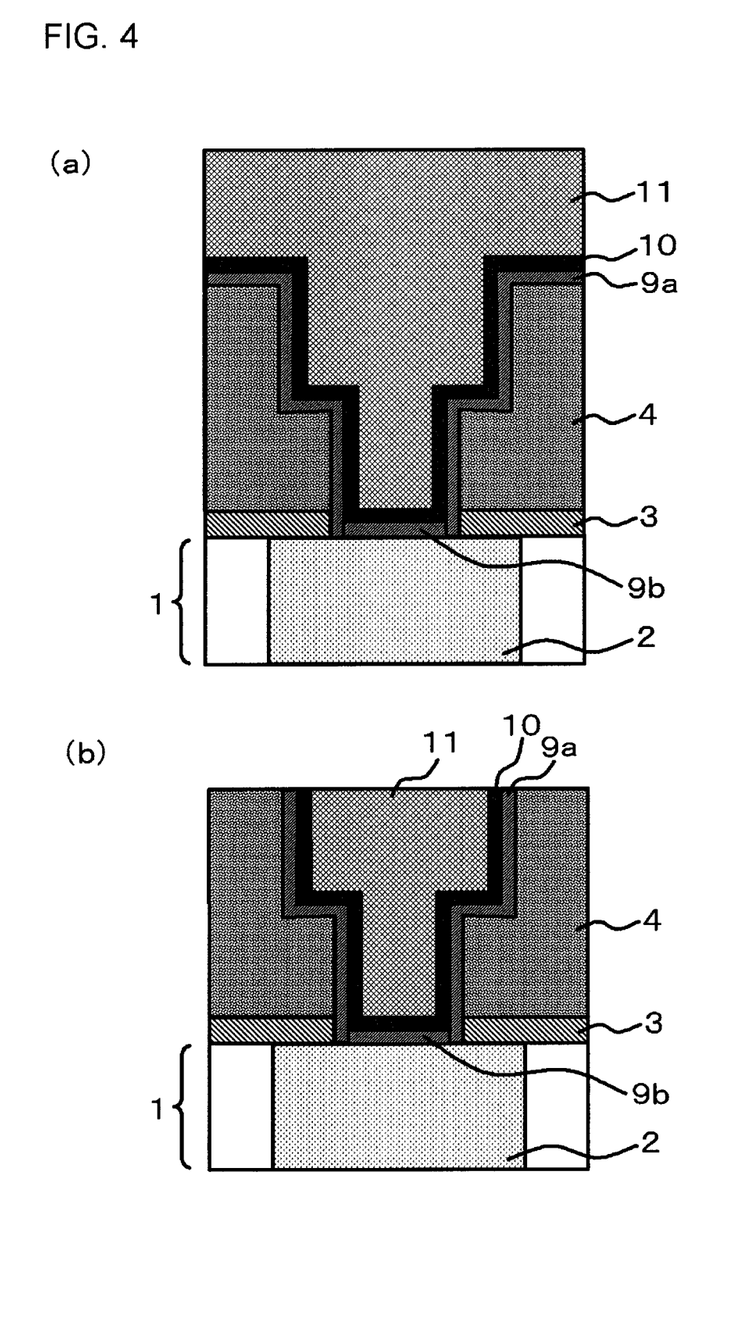
FIG. 4 is a cross-sectional view showing steps of a method of manufacturing a semiconductor device according to the second embodiment.

Referring to FIG. 4(b), a semiconductor device of the present embodiment includes a first interconnect 2, a porous dielectric layer 4 formed on the first interconnect 2, and a second interconnect 11 buried in the porous dielectric layer 4 and electrically connected to the first interconnect 2. Further, between the porous dielectric layer 4 and the second interconnect 11, a carbon-containing metal film 9a and a barrier metal film 10 are provided in the order from the porous dielectric layer 4. A metal film 9b is provided between the first interconnect 2 and the barrier metal film 10.

The carbon-containing metal film 9a contains carbonized metal similar to that in the first embodiment. Here, in the present embodiment, the film thickness of the carbon-containing metal film 9a is 3 nm or more and 50 nm or less. In the present embodiment, description is given by an example using a carbon-containing metal film 9a having a film thickness of about 25 nm.

In the present embodiment, the film thickness of the barrier metal film 10 is about 10 nm.

Next, a method of manufacturing a semiconductor device in the present embodiment is described.

Figure 3:
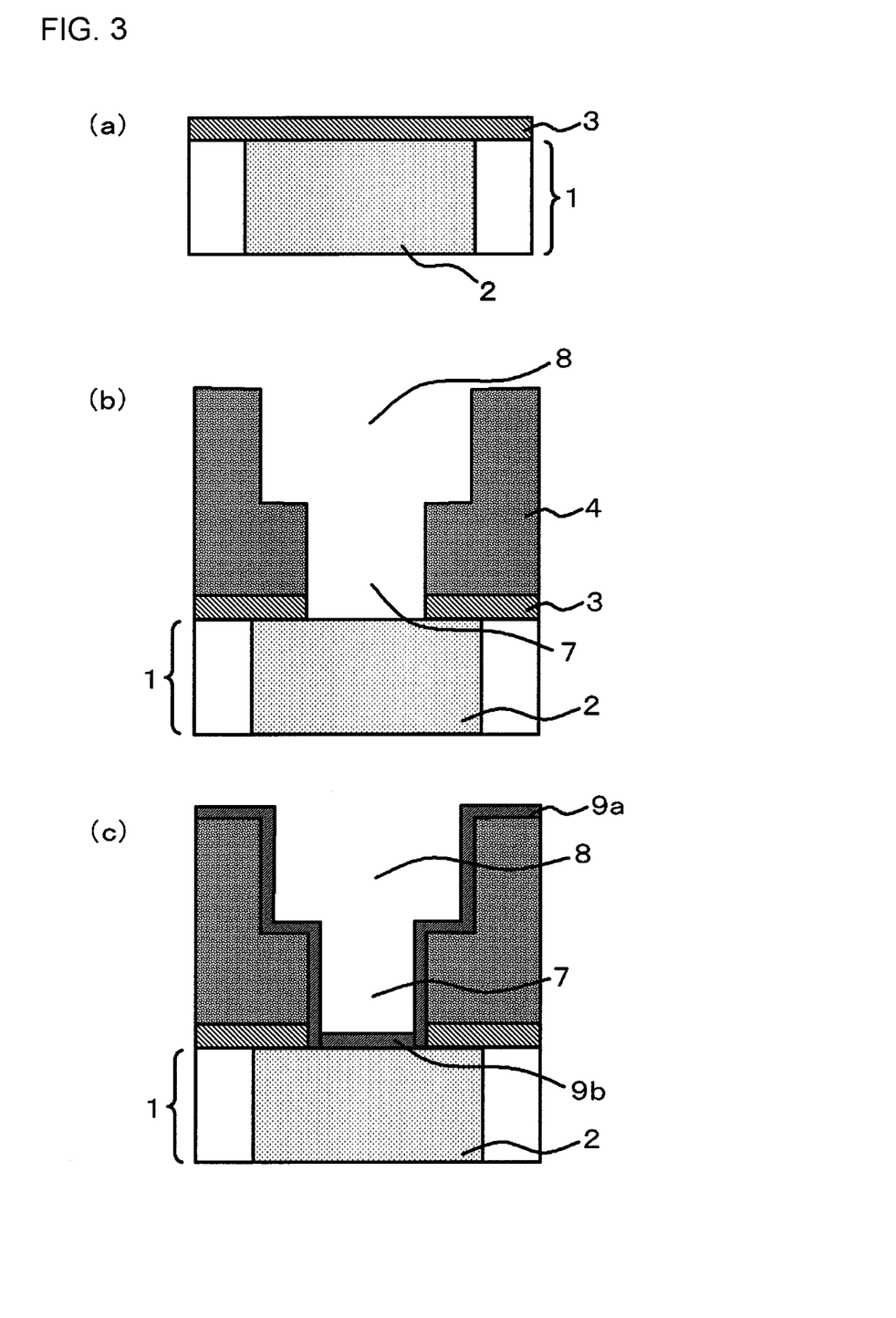
FIG. 3 is a cross-sectional view showing steps of a method of manufacturing a semiconductor device according to a second embodiment.

The method of manufacturing a semiconductor device in the present embodiment includes the following:

(a) forming a porous dielectric layer 4 over a first interconnect 2 (FIGS. 3(a) to 3(b));

(b) forming an interconnect trench (via 7 and trench 8) in the porous dielectric layer 4 (FIG. 3(b));

(c) impregnating the porous dielectric layer 4 with a reactive carbon-containing compound;

(d) depositing a metal film on the surface of the porous dielectric layer 4 located at the side surface of the via 7 and the trench 8 and on the surface of the first interconnect 2 exposed at the bottom surface of the via 7, and forming a carbon-containing metal film 9a on the surface of the porous dielectric layer 4 by introducing the carbon contained in the reactive carbon-containing compound into the metal film (FIG. 3(c));

(e) forming a barrier metal film 10 on the carbon-containing metal film 9a and on the metal film 9b; and (f) forming a second interconnect 11 in the interconnect trench (via 7 and trench 8) where the carbon-containing metal film 9a is formed (FIGS. 4(a) to 4(b)).

Here, only (e) and (f) which are different from those in the first embodiment is described.

(e): Forming a Barrier Metal Film 10 on the Carbon-Containing Metal Film 9a and on the Metal Film 9b (FIG. 4(a))

In the present embodiment, the barrier metal film 10 can be formed by an ordinary method. As a metal constituting the barrier metal film 10, one having a large effect of suppressing diffusion of the metal constituting the second interconnect 11 can be used.

(f): Forming a Second Interconnect 11 in the Interconnect Trench (Via 7 and Trench 8) where the Carbon-Containing Metal Film 9a is Formed (FIGS. 4(a) to 4(b))

In the present embodiment, after a power-feeding film is attached onto the surface of the carbon-containing metal film 9a and onto the surface of the metal film 9b, Cu or Al is buried in the via 7 and the trench 8 by the plating method (FIG. 4(a)).

Then, extraneous metal and the like are removed by the ordinary CMP method, so as to form a second interconnect 11 (FIG. 4(b)).

Then, a semiconductor device is thereafter manufactured by an ordinary process.

Hereafter, the effects of the present embodiment is described.

Since the semiconductor device of the present embodiment includes a barrier metal film 10 on the carbon-containing metal film 9a, diffusion of metal from the second interconnect 11 to the porous dielectric layer 4 is furthermore suppressed. For this reason, generation of electromigration, stress migration, or the like is suppressed, whereby the connection reliability is improved. Therefore, a semiconductor device having an interconnect of high quality with a long operation-ensuring lifetime can be provided.

As shown above, the embodiments of the present invention have been described with reference to the drawings; however, these are exemplifications of the present invention, so that various constructions other than the above can also be adopted.

In the semiconductor device of the first embodiment, description has been given by an example in which the carbon-containing metal film 9a has a uniform composition. However, the carbon concentration of the near-surface region of the carbon-containing metal film 9a on the porous dielectric layer 4 may be higher than the carbon concentration of the near-surface region of the carbon-containing metal film 9a on the second interconnect 11.

In the method of manufacturing a semiconductor device of the present embodiment, the porous dielectric layer 4 is impregnated with a reactive carbon-containing compound by using the reactive carbon-containing compound that has been vaporized. However, the porous dielectric layer 4 can be impregnated with a reactive carbon-containing compound by allowing a solvent or the like, into which the reactive carbon-containing compound has been dissolved or dispersed, to penetrate into fine pores, and then performing heating and drying.

The invention claimed is:

1. A semiconductor device comprising:
   a first interconnect;
   a porous dielectric layer formed over said first interconnect;
   a second interconnect buried in said porous dielectric layer and electrically connected to said first interconnect; and
   a carbon-containing metal film that is disposed between said porous dielectric layer and said second interconnect and isolates these layers,
   wherein said carbon-containing metal film is on a surface of said porous dielectric layer,
   wherein a carbon concentration of a near-surface region of said carbon-containing metal film adjacent said porous dielectric layer is higher than a carbon concentration of a near-surface region of said carbon-containing film adjacent said second interconnect, and
   wherein said porous dielectric layer does not comprise carbon.

2. The semiconductor device as claimed in claim 1, wherein said carbon-containing metal film is not formed between said first interconnect and said second interconnect.

3. The semiconductor device as claimed in claim 1, wherein a barrier metal film is provided between said carbon-containing metal film and said second interconnect.

4. The semiconductor device as claimed in claim 1, wherein said carbon-containing metal film is TiC, TaC, WC or $AlC_3$.

5. The semiconductor device as claimed in claim 1, wherein said porous dielectric layer comprises $SiO_2$.

6. The semiconductor device as claimed in claim 1, wherein the film thickness of said carbon-containing metal film is 3 nm or more and 50 nm or less.

7. A method of manufacturing a semiconductor device comprising:
   forming a porous dielectric layer over a first interconnect;
   forming an interconnect trench in said porous dielectric layer;
   impregnating said porous dielectric layer with a reactive carbon-containing compound;
   depositing a metal film on the surface of said porous dielectric layer located at the side surface of said interconnect trench and on the surface of said first interconnect exposed at the bottom surface of said interconnect trench, and forming a carbon-containing metal film on the surface of said porous dielectric layer by introducing the carbon contained in said reactive carbon-containing compound into said metal film; and
   forming a second interconnect in said interconnect trench where said carbon-containing metal film is formed,
   wherein said impregnating with a reactive carbon-containing compound includes immersing said porous dielectric layer in which said interconnect trench is formed into a solution containing said reactive carbon-containing compound, followed by heating and drying.

8. The method of manufacturing a semiconductor device as claimed in claim 7, wherein said impregnating with a reactive carbon-containing compound includes impregnating said porous dielectric layer with a reactive carbon-containing compound in an atmosphere containing said reactive carbon-containing compound that has been vaporized.

9. The method of manufacturing a semiconductor device as claimed in claim 7, wherein
   said reactive carbon-containing compound is thermally reactive, and
   said forming said carbon-containing metal film includes depositing a metal film by sputtering on the surface of said porous dielectric layer and on the surface of said first interconnect exposed at the bottom surface of said interconnect trench, and introducing the carbon contained in said reactive carbon-containing compound into the metal film by heat provided in this sputtering.

10. The method of manufacturing a semiconductor device as claimed in claim 7, which includes forming a barrier metal film over said carbon-containing metal film after said forming said carbon-containing metal film.

11. The method of manufacturing a semiconductor device as claimed in claim 7, wherein said reactive carbon-containing compound is selected from cyclic siloxane and secondary alcohol.

12. The method of manufacturing a semiconductor device as claimed in claim 7, wherein said carbon-containing metal film contains TiC, TaC, WC, or $AlC_3$.

13. The method of manufacturing a semiconductor device as claimed in claim 7, wherein the film thickness of said carbon-containing metal film is 3 nm or more and 50 nm or less.

* * * * *